(12) United States Patent
Lee

(10) Patent No.: US 11,049,938 B2
(45) Date of Patent: Jun. 29, 2021

(54) P-TYPE LATERAL DOUBLE DIFFUSED MOS TRANSISTOR AND METHOD OF MANUFACTURING THE SAME

(71) Applicant: DB HITEK CO., LTD., Seoul (KR)

(72) Inventor: Chang Eun Lee, Seoul (KR)

(73) Assignee: DB HITEK CO., LTD., Seoul (KR)

( * ) Notice: Subject to any disclaimer, the term of this patent is extended or adjusted under 35 U.S.C. 154(b) by 14 days.

(21) Appl. No.: 16/218,978

(22) Filed: Dec. 13, 2018

(65) Prior Publication Data

US 2019/0181227 A1 Jun. 13, 2019

(30) Foreign Application Priority Data

Dec. 13, 2017 (KR) .................. 10-2017-0170918

(51) Int. Cl.
*H01L 29/10* (2006.01)
*H01L 29/66* (2006.01)
(Continued)

(52) U.S. Cl.
CPC ...... *H01L 29/1045* (2013.01); *H01L 29/0615* (2013.01); *H01L 29/0634* (2013.01);
(Continued)

(58) Field of Classification Search
CPC ........... H01L 29/1045; H01L 29/66681; H01L 29/0615; H01L 29/6659; H01L 29/0878; H01L 29/7816
See application file for complete search history.

(56) References Cited

U.S. PATENT DOCUMENTS 6,894,348 B2 * 5/2005 Terashima .......... H01L 29/0619
257/327
8,138,049 B2 * 3/2012 You ..................... H01L 27/0922
257/E29.261
(Continued)

FOREIGN PATENT DOCUMENTS

KR 1020050055223 A 6/2005
KR 1020060077006 A 7/2006
(Continued)

OTHER PUBLICATIONS

Stanley Wolf, Silicon Processing for the VSLI Era, 1990, Lattice Press, vol. 2, pp. 23-24.
(Continued)

*Primary Examiner* — Eugene Lee
(74) *Attorney, Agent, or Firm* — Patterson Thuente Pedersen, P.A.

(57) ABSTRACT

A PLDMOS transistor includes a substrate, a P-type drift region disposed on an upper surface of the substrate, a first body region of N-type conductivity, the first body region being disposed on one side of the drift region and having a channel region formed thereon, a drain extension region of P-type conductivity, the drain extension region being disposed on another side of the drift region and being spaced apart from the first body region, a P-type drain region disposed on the drain extension region, a gate structure disposed on the channel region, an N-type buried layer disposed under the drift region and first and second breakdown voltage increasing layers being configured to increase the breakdown voltage by providing reduced surface fields.

3 Claims, 2 Drawing Sheets

(51) Int. Cl.
  *H01L 29/06* (2006.01)
  *H01L 29/08* (2006.01)
  *H01L 29/78* (2006.01)

(52) U.S. Cl.
  CPC ...... *H01L 29/0878* (2013.01); *H01L 29/1083* (2013.01); *H01L 29/1087* (2013.01); *H01L 29/6659* (2013.01); *H01L 29/66681* (2013.01); *H01L 29/66689* (2013.01); *H01L 29/7816* (2013.01)

(56) References Cited

U.S. PATENT DOCUMENTS

| | | | |
|---|---|---|---|
| 8,236,642 B2* | 8/2012 | Wei | H01L 29/7835 257/E21.382 |
| 8,389,341 B2 | 3/2013 | Huang et al. | |
| 8,623,732 B2* | 1/2014 | Grote | H01L 29/0634 438/369 |
| 9,082,841 B1 | 7/2015 | Chang et al. | |
| 9,171,916 B1 | 10/2015 | Snyder et al. | |
| 9,373,712 B2 | 6/2016 | Wang et al. | |
| 9,461,117 B2 | 10/2016 | Ko | |
| 9,496,389 B2* | 11/2016 | Kim | H01L 29/66659 |
| 9,941,364 B2 | 4/2018 | Jung et al. | |
| 10,008,594 B2 | 6/2018 | Choi et al. | |
| 10,297,676 B2* | 5/2019 | Yang | H01L 29/66659 |
| 2006/0141714 A1 | 6/2006 | Lee | |
| 2008/0173951 A1* | 7/2008 | Ma | H01L 21/823892 257/372 |
| 2008/0182394 A1 | 7/2008 | Yang et al. | |
| 2010/0123195 A1 | 5/2010 | Lee | |
| 2011/0227154 A1* | 9/2011 | Ono | H01L 29/0634 257/335 |
| 2012/0094457 A1* | 4/2012 | Gabrys | H01L 29/0653 438/286 |
| 2012/0168869 A1 | 7/2012 | Hikida | |
| 2012/0175673 A1 | 7/2012 | Lee | |
| 2012/0175679 A1 | 7/2012 | Marino et al. | |
| 2012/0306010 A1 | 12/2012 | Lerner et al. | |
| 2013/0270606 A1* | 10/2013 | Chen | H01L 29/7835 257/183 |
| 2013/0292763 A1 | 11/2013 | Chang | |
| 2014/0070312 A1 | 3/2014 | Yang et al. | |
| 2015/0069509 A1* | 3/2015 | Lee | H01L 29/7835 257/343 |
| 2015/0123199 A1 | 5/2015 | Chen et al. | |
| 2015/0380398 A1* | 12/2015 | Mallikarjunaswamy | H01L 29/7823 257/272 |
| 2016/0087039 A1 | 3/2016 | Ko | |
| 2016/0351706 A1 | 12/2016 | Jung et al. | |
| 2017/0222042 A1* | 8/2017 | Lee | H01L 29/7824 |
| 2017/0294505 A1 | 10/2017 | Shin et al. | |
| 2019/0245041 A1* | 8/2019 | Chen | H01L 29/0882 |

FOREIGN PATENT DOCUMENTS

| | | |
|---|---|---|
| KR | 100752194 B1 | 8/2007 |
| KR | 1020100056101 A | 5/2010 |

OTHER PUBLICATIONS

Amendment and Written Opinion for Korean Application No. 10-2015-0074769, dated Jul. 20, 2016, 17 pages.
Grant of Patent for Korean Application No. 10-2015-0074769, dated Nov. 26, 2016, 2 pages.
Notification of Reason for Refusal for Korean Application No. 10-2015-0074769, dated May 20, 2016, 15 pages.

* cited by examiner

P-TYPE LATERAL DOUBLE DIFFUSED MOS TRANSISTOR AND METHOD OF MANUFACTURING THE SAME

CROSS-REFERENCE TO RELATED APPLICATION

This application claims priority to Korean Patent Application No. 10-2017-0170918, filed on Dec. 13, 2017 and all the benefits accruing therefrom under 35 U.S.C. § 119, the contents of which are incorporated by reference in their entirety.

TECHNICAL FIELD

The present disclosure relates to a MOS transistor and a method of manufacturing the same. More particularly, the present disclosure relates to a P-type lateral double diffused MOS transistor (PLDMOS) and a method of manufacturing the PLDMOS transistor.

BACKGROUND

A commonly-used power metal-oxide semiconductor (MOS) field effect transistor (MOSFET) device has higher input impedance than a bipolar transistor, so the power gain is large and the gate drive circuit is very simple. Further, since the MOSFET device is a unipolar device, the MOSFET device may avoid the time-delay which that be caused by accumulation or recombination by minor carriers when the MOSFET device is turned off. Therefore, the MOSFET device has been implemented for applications such as a switching mode power supplier, a lamp stabilizer, and a motor driving circuit. Examples of power MOSFET devices include double diffused MOS transistor structures using general planar diffusion technology, which have been widely used, and lateral double-diffused MOS transistors (hereinafter, referred to as an LDMOS transistor).

In particular, LDMOS transistors have a relatively fast switching speed, a relatively high breakdown voltage, and a relatively low on-resistance ($R_{on}$), such that research and development have conventionally concentrated on improvements to the LDMOS transistor.

Conventional LDMOS transistors are limited by a relatively low operating voltage of about 80V. LDMOS transistors are therefore at risk for being damaged due to electric fields being concentrated near an edge portion of the gate if the operating voltage reaches to 100V or more. Therefore, an need exists for LDMOS transistors having an operating voltage of 100 V.

SUMMARY

The example embodiments of the present disclosure provide a PLDMOS transistor to be configured to be driven at a relatively high operating voltage. The example embodiments of the present disclosure further provide a method of manufacturing a PLDMOS transistor which may be driven at a relatively high operating voltage.

According to example embodiments of the present disclosure, a PLDMOS transistor includes a substrate, a P-type drift region disposed on an upper surface of the substrate, a first body region of N-type conductivity, the first body region being disposed on a first side of the drift region and having a channel region formed thereon, a drain extension region of P-type conductivity, the drain extension region being disposed on a second side of the drift region, spaced apart from the first body region, a P-type drain region disposed on the drain extension region, a gate structure disposed on the channel region, an N-type buried layer disposed under the drift region, a first breakdown voltage increasing layer disposed between the drift region the N-type buried layer and below the first body region, the first breakdown voltage increasing layer being configured to increase a breakdown voltage by providing a reduced surface field (RESURF), and a second breakdown voltage increasing layer disposed between the drift region and the N-type buried layer and below the drain region, spaced apart from the first breakdown voltage increasing layer, the second first breakdown voltage increasing layer being configured to increase the breakdown voltage by providing a RESURF.

In an example embodiment, the PLDMOS transistor may further include a plug disposed over the substrate and electrically connected to the N-type buried layer.

In an example embodiment, the N-type buried layer may be spaced apart from a lower surface of the drift region.

According to example embodiments of the present disclosure, a PLDMOS transistor is manufactured by forming an N-type buried layer in a substrate, growing a P-type epitaxial layer from the N-type buried layer, forming a first breakdown voltage increasing layer and a second breakdown voltage-increasing layer, spaced apart from each other in the P-type epitaxial layer, over the N-type buried layer, forming an P-type drift region on the first breakdown voltage increasing layer and the second breakdown voltage increasing layer, forming a first body region of an N-type conductivity in an upper portion of the drift region, located to correspond to an upper portion of the first breakdown voltage increasing layer such that a channel region is defined, forming a drain extension region of a P-type conductivity in the upper portion of the drift region, located to correspond to an upper portion of the second breakdown voltage increasing layer, the drain extension region being spaced apart from the first body region, forming a P-type drain region on a top portion of the drain extension region, and forming a gate structure on the channel region.

In an example embodiment, a plug may be further formed over the substrate and electrically connected to the N-type buried layer.

In an example embodiment, the N-type buried layer may be spaced apart from a lower surface of the drift region.

According to some example embodiments of the PLDMOS transistor and the method for manufacturing the same, the first and second breakdown voltages increasing layers are provided between the drift region and the N-type buried layer, a double RESURF (Reduced SURface Field) phenomena may occur, improving characteristics of the PLDMOS transistor. Therefore, when a bias is applied to the drain region of the PLDMOS transistor, a depletion region is expanded from the first and second breakdown voltage increasing layers and the drift region, respectively, thereby relieving electric field which may occur at an edge portion of the gate conductive layer. As a result, the breakdown voltage of the PLDMOS transistor is greatly improved, and failure or damage of a high-voltage device using the PLDMOS transistor may be prevented.

The above summary is not intended to describe each illustrated embodiment or every implementation of the subject matter hereof. The figures and the detailed description that follow more particularly exemplify various embodiments.

BRIEF DESCRIPTION OF THE DRAWINGS

Example embodiments can be understood in more detail from the following description taken in conjunction with the accompanying drawings, in which.

Figure 1:
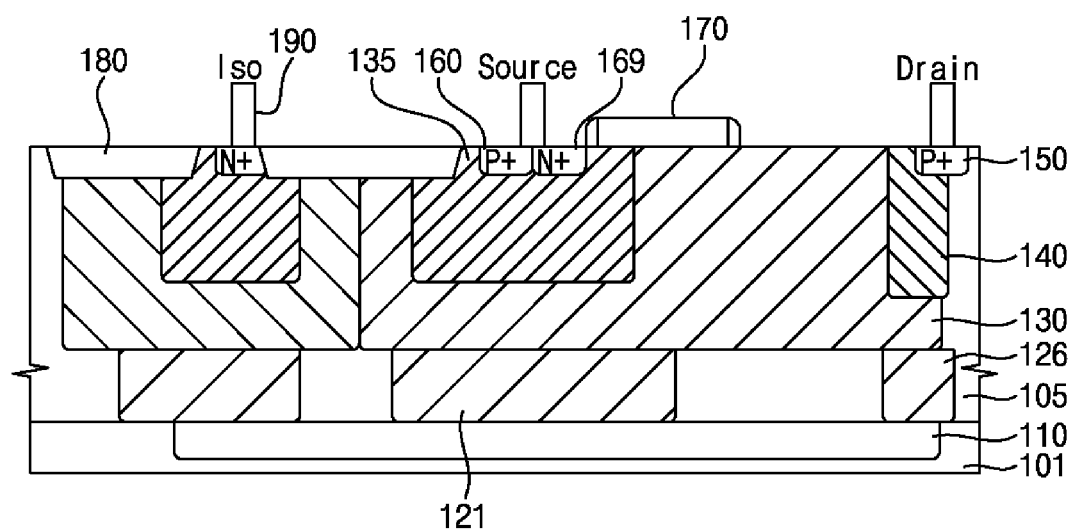
FIG. 1 is a sectional view illustrating a PLDMOS transistor in accordance with an embodiment of the present disclosure.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION

Hereinafter, specific embodiments will be described in more detail with reference to the accompanying drawings. The present disclosure may, however, be embodied in different forms and should not be construed as limited to the embodiments set forth herein.

As an explicit definition used in this application, when a layer, a layer, a region or a plate is referred to as being 'on' another one, it can be directly on the other one, or one or more intervening layers, layers, regions or plates may also be present. Unlike this, it will also be understood that when a layer, a layer, a region or a plate is referred to as being 'directly on' another one, it is directly on the other one, and one or more intervening layers, layers, regions or plates do not exist. Also, though terms like a first, a second, and a third are used to describe various components, compositions, regions and layers in various embodiments of the present disclosure are not limited to these terms.

Furthermore, and solely for convenience of description, elements may be referred to as "above" or "below" one another. It will be understood that such description refers to the orientation shown in the Figure being described, and that in various uses and alternative embodiments these elements could be rotated or transposed in alternative arrangements and configurations.

In the following description, the technical terms are used only for explaining specific embodiments while not limiting the scope of the present disclosure. Unless otherwise defined herein, all the terms used herein, which include technical or scientific terms, may have the same meaning that is generally understood by those skilled in the art.

The depicted embodiments are described with reference to schematic diagrams of some embodiments of the present disclosure. Accordingly, changes in the shapes of the diagrams, for example, changes in manufacturing techniques and/or allowable errors, are sufficiently expected. Accordingly, embodiments of the present disclosure are not described as being limited to specific shapes of areas described with diagrams and include deviations in the shapes and also the areas described with drawings are entirely schematic and their shapes do not represent accurate shapes and also do not limit the scope of the present disclosure.

FIG. 1 is a sectional view illustrating a PLDMOS transistor in accordance with an embodiment of the present disclosure.

Referring to FIG. 1, a PLDMOS transistor according to an embodiment of the present disclosure includes a substrate 101, a drift region 130, a first body region 135, a drain extension region 140, a drain region 150, a gate structure 170, an N-type buried layer 110, a first breakdown voltage increasing layer 121, and a second breakdown voltage increasing layer 126.

An active region of the substrate 101 is defined by a device isolation layer 180. The substrate 101 may include a silicon substrate. The substrate 101 may include an epitaxial layer 105 formed through an epitaxial growth process.

The drift region 130 is formed on the substrate 101. The drift region 130 is provided in the active region. The drift region 130 corresponds to an area where charges such as electrons or holes may drift. The drift region 130 may include a doping element of a Group III element such as boron, gallium, or indium. The drift region 130 may have a first charge carrier concentration.

The first body region 135 is formed on one side of the drift region 130. The first body region 135 comprises at least one N-type dopant therein. The N-type dopants may include nitrogen, phosphorus, arsenic, antimony, bismuth, or the like.

A source region 160 may be formed on the first body region 135. Accordingly, a part of the first body region 135 may function as a channel region.

The drain extension region 140 is formed on another side of the drift region 130. The drain extension region 140 is spaced apart from the first body region 135.

The drain extension region 140 may be doped with P-type dopants. That is, the P-type dopants may include a doping element composed of a Group III element such as boron, gallium, or indium.

The drain extension region 140 may have a second charge carrier concentration that is higher than the first charge carrier concentration of the drift region 130. The drain extension region 140 is connected to a drain region 150. In operation, excess charge can be flow through the drain extension region 140 to the drain region 150. This can result in an increase in the breakdown voltage of the PLDMOS transistor.

Referring again to FIG. 1, the drain region 150 is formed on the drain extension region 140. The drain region 150 is electrically connected to the drain extension region 140. The drain region 150 may be doped with P-type dopants having a third charge carrier concentration. The third charge carrier concentration may be greater than the first and second charge carrier concentrations. The drain region 150 is further electrically connected to a drain electrode.

The gate structure 170 is located within the active region. The gate structure 170 is disposed between the source region 160 and the drain region 150 on the channel region of the first body region 135. The gate structure 170 includes a gate insulating layer and a gate electrode. The channel region may be turned on or off by a gate voltage applied to the gate structure 170.

The N-type buried layer 110 is disposed under the drift region 130. The N-type buried layer 110 is formed to be spaced apart from the drift region 130 in a vertical direction. That is, the N-type buried layer 110 is located at a lower portion of the substrate 101. The N-type buried layer 110 may be connected to the drift region 130 through the first breakdown voltage increasing layer 121 and the second breakdown voltage increasing layer 126. The N-type buried layer 110 may prevent charges generated by the voltage applied to the drain electrode from flowing into the substrate 101. That is, the N-type buried layer 110 may suppress punch-through current from occurring.

Meanwhile, the N-type buried layer 110 may be electrically connected to a plug 190.

Referring again to FIG. 1, the first breakdown voltage increasing layer 121 is disposed between the drift region 130 and the N-type buried layer 110. The first breakdown voltage increasing layer 121 is disposed below the first body region 135. The first breakdown voltage increasing layer 121 is doped with N-type dopants.

The first breakdown voltage increasing layer 121 may increase the breakdown voltage by a providing a reduced surface field (RESURF). That is, when a bias is applied to the drain region 150, a depletion region is extended to the drift region 130 and the first breakdown voltage increasing layer 121, respectively. Therefore, the electric field may be relaxed at an edge portion owing to an extension of the depletion region.

The second breakdown voltage increasing layer 126 is disposed between the drift region 130 and the N-type buried layer 110. In addition, the second breakdown voltage increasing layer 126 is disposed below the drain region 150 in the vertical direction. The second breakdown voltage increasing layer 126 is doped with N-type dopants.

The second breakdown voltage increasing layer 126 may further increase the breakdown voltage by providing a reduced surface field (RESURF). That is, when a bias is applied to the drain region 150, the depletion region is extended to the drift region 130, the first breakdown voltage increasing layer 121 and the second breakdown voltage increasing layer 126, respectively. The electric field formed at the edge portion may be further relaxed due to the extension of the depletion region.

Figure 2:
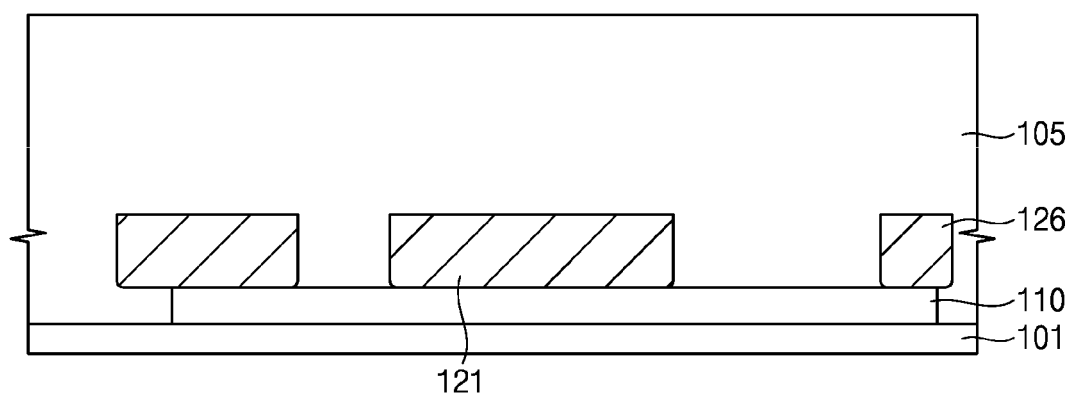
FIGS. 2 to 4 are sectional views illustrating a method of manufacturing a PLDMOS transistor according to an embodiment of the present disclosure.
Figure 3:
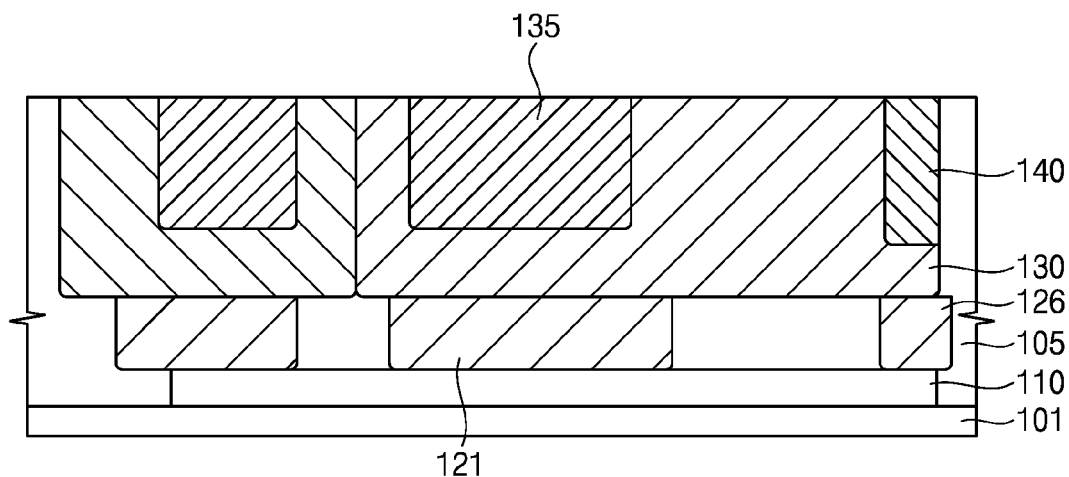
Figure 4:
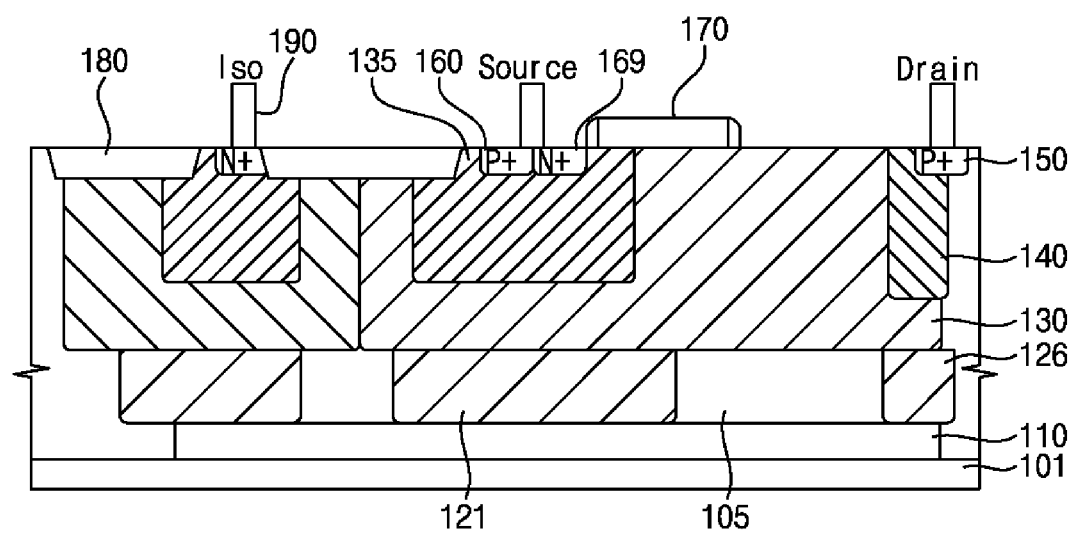

FIGS. 2 to 4 are cross sectional views illustrating a method of manufacturing a PLDMOS transistor according to an embodiment of the present disclosure.

Referring to FIG. 2, a first conductive type (for example, P type) epitaxial layer 105 is grown on a substrate 101. For example, the epitaxial layer 105 may be formed by sequentially forming a lower epitaxial layer and an upper epitaxial layer.

Second conductivity type (for example, N type) dopants may be implanted into the epitaxial layer 105 through an ion implantation process to form a buried layer 110 having an N type conductivity.

Then, a photolithography process is performed on the epitaxial layer 105 to form a first photoresist pattern (not shown) exposing one region of the epitaxial layer 105. N-type dopants are implanted into the epitaxial layer 105 using the first photoresist pattern as a mask. The N-type dopants are injected into the epitaxial layer 105 on one region of the N-type buried layer 110 to form a first breakdown voltage increasing layer 121 and second breakdown voltage increasing layer 126 spaced apart from each other, respectively.

Next, as shown in FIG. 3, after the first photoresist pattern is removed through an ashing or a strip process, P-type dopants are implanted into the epitaxial layer 105. The P-type dopants may include boron. As a result, a P-type drift region 130 is formed on the first and second breakdown voltage increasing layers 121 and 126.

Then, using a second photoresist pattern (not shown) as a mask, N-type dopants are implanted into an upper portion of one side of the drift region 130. example embodiments, the N-type dopants may comprise Group 5 elements (e.g., phosphorus, antimony, or arsenic). Thus, the first body region 135 is formed. Similarly, the second photoresist pattern (not shown) is used as a mask to inject P-type dopants into an upper portion of another side of the drift region 130. In embodiments, the P-type dopants may comprise Group 3 elements (e.g., boron, gallium, or indium). Thus, the drain extension region 140 is formed.

For example, the first body region 135 and the drain extension region 140 are implanted to a thickness smaller than the drift region 130. Accordingly, the first body region 135 and the drain extension region 140 may be spaced apart from the first and second breakdown voltage increasing layers 121 and 126 in a vertical direction.

After the second photoresist pattern is removed through an ashing or stripping process, a diffusion process may be further performed through an annealing process.

Referring to FIG. 4, a field oxide layer 180 is formed on a surface of the epitaxial layer 105. In embodiments, the field oxide layer 180 made of a field oxide may be formed using a conventional Local Oxidation of Silicon (LOCOS) technology.

Next, an N-type impurity and a P-type impurity are implanted into the first body region 135 and the drain extension region 140 to form a source region 160 and a drain region 150, respectively.

Then, a gate structure 170 is formed on the first body region 135 between the source region 160 and the drain extension region 140.

P conductive impurities are then implanted into the first body region 135 to form a body contact 169 (P+).

Although the PLDMOS transistor has been described with reference to the specific embodiments, they are not limited thereto. Therefore, it will be readily understood by those skilled in the art that various modifications and changes can be made thereto without departing from the spirit and scope of the appended claims.

Various embodiments of systems, devices, and methods have been described herein. These embodiments are given only by way of example and are not intended to limit the scope of the claimed inventions. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the claimed inventions.

Persons of ordinary skill in the relevant arts will recognize that embodiments may comprise fewer features than illustrated in any individual embodiment described above. The embodiments described herein are not meant to be an exhaustive presentation of the ways in which the various features may be combined. Accordingly, the embodiments are not mutually exclusive combinations of features; rather, embodiments can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Moreover, reference in the specification to "one embodiment," "an embodiment," or "some embodiments" means that a particular feature, structure, or characteristic, described in connection with the embodiment, is included in at least one embodiment of the teaching. The appearances of the phrase "in one embodiment" in various places in the specification are not necessarily all referring to the same embodiment.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims, it is expressly intended that the provisions of Section 112, sixth paragraph of 35 U.S.C. are not to be invoked unless the specific terms "means for" or "step for" are recited in a claim.

What is claimed is:

1. A P-type lateral double diffused metal-oxide semiconductor (PLDMOS) transistor comprising:

a substrate;

a P-type drift region disposed on an upper surface of the substrate;

a first body region of N-type conductivity, the first body region being disposed on a first side of the drift region and having a channel region formed thereon;

a drain extension region of P-type conductivity, the drain extension region being disposed on a second side of the drift region spaced apart from the first body region;

a P-type drain region disposed on the drain extension region;

a gate structure disposed on the channel region;

an N-type buried layer disposed under the drift region;

a first breakdown voltage increasing layer disposed between the drift region and the N-type buried layer and directly below the first body region, the first breakdown voltage increasing layer being configured to increase a breakdown voltage of the transistor by providing a reduced surface field (RESURF); and a second breakdown voltage increasing layer disposed between the drift region and the N-type buried layer and directly below the drain region, spaced apart from the first breakdown voltage increasing layer, the second first breakdown voltage increasing layer being configured to increase the breakdown voltage by providing a RESURF such that when a bias is applied to the P-type drain region, a depletion region is extended to the P-type drift region, the first breakdown voltage increasing layer and the second breakdown voltage increasing layer to relax an electric field formed at an edge portion of the gate structure.

2. The PLDMOS transistor of claim 1, further comprising a plug disposed over the substrate and electrically connected to the N-type buried layer.

3. The PLDMOS transistor of claim 1, wherein the N-type buried layer is spaced apart from a lower surface of the drift region.

* * * * *